United States Patent [19]
Turner et al.

[11] Patent Number: 6,022,784
[45] Date of Patent: Feb. 8, 2000

[54] METHOD FOR MANUFACTURING A SEMICONDUCTOR DEVICE

[75] Inventors: Charles L. Turner, Tempe; Jeffrey Drew Van Wagoner, Gilbert, both of Ariz.

[73] Assignee: Motorola, Inc., Schaumburg, Ill.

[21] Appl. No.: 09/055,457

[22] Filed: Apr. 6, 1998

[51] Int. Cl.[7] .................................................. H01L 21/336
[52] U.S. Cl. ........................ 438/303; 438/268; 438/290; 438/770; 438/138
[58] Field of Search ...................... 438/303, 305, 438/306, 307, 268, 138, 770, 585, 290; 148/DIG. 116, DIG. 117, DIG. 118

[56] References Cited

U.S. PATENT DOCUMENTS

| | | | |
|---|---|---|---|
| 4,133,701 | 1/1979 | Greenstein et al. | 438/340 |
| 4,784,975 | 11/1988 | Hofmann et al. | 438/770 |
| 4,786,609 | 11/1988 | Chen | 438/303 |
| 4,960,723 | 10/1990 | Davies | 438/274 |
| 5,371,026 | 12/1994 | Hayden et al. | 438/303 |
| 5,405,791 | 4/1995 | Ahmad et al. | 438/228 |
| 5,637,514 | 6/1997 | Jeng et al. | 438/305 |

*Primary Examiner*—Michael Trinh
*Attorney, Agent, or Firm*—Anthony M. Martinez

[57] ABSTRACT

A method (50) for designing a semiconductor device (10). The method (50) has an annealing step (59). In the annealing step (59), the semiconductor device (10) is annealed in an ambient containing oxygen. The oxygen has a partial pressure of greater than 11.85 Torr. The annealing step (59) results in a reduction of uncontrolled doping from the gate electrode (33) of the semiconductor device (10) to the channel region of the semiconductor device (10).

20 Claims, 2 Drawing Sheets

6,022,784

METHOD FOR MANUFACTURING A SEMICONDUCTOR DEVICE

FIELD OF THE INVENTION

The present invention relates, in general, to semiconductor devices and, more particularly, to semiconductor device processing.

BACKGROUND OF THE INVENTION

As those skilled in the art are aware, the threshold voltage ($V_T$) of an insulated gate semiconductor device is related to the voltage at which the insulated gate semiconductor device turns on. For example, the gate-source voltage ($V_{GS}$) of an N-channel insulated gate semiconductor device must exceed $V_T$ to form a channel in the device. Since the voltage at the gate is typically the input voltage of the insulated gate semiconductor device, the input voltage relative to the source voltage must exceed $V_T$ for a channel to be formed. In other words, a significant drain current ($I_D$) will not flow through the channel region of the insulated gate semiconductor device unless $V_{GS}$ is greater than $V_T$. In addition, $V_T$ is important in determining the saturation current of an insulated gate semiconductor device.

An important factor affecting the threshold voltage is the dopant or carrier concentration in the channel region of the insulated gate semiconductor device. $V_T$ can be changed by adding a dopant of either P or N conductivity type to the channel region. For example, when the substrate material of the channel region is doped with a dopant of P conductivity type, $V_T$ can be lowered by adding a dopant of N conductivity type and raised by adding a dopant of P conductivity type. Although modulating $V_T$ by changing the dopant concentration of the channel region is a useful technique, it can be undesirable when the channel region is doped in an uncontrolled fashion. One example of uncontrolled doping is when autodoping from the gate electrode occurs. In this instance, dopant from the gate electrode diffuses through the gate oxide into the channel region. Because the doping is uncontrolled, $V_T$ is not stable.

Accordingly, it would be advantageous to have a method for manufacturing semiconductor devices that is resistant to modulation by autodoping. It would be of further advantage for the method to be compatible with standard semiconductor processing techniques and to be cost efficient.

DETAILED DESCRIPTION OF THE DRAWINGS

Generally, the present invention provides a method for manufacturing semiconductor devices that reduces variation of threshold voltages between these semiconductor devices. The method includes increasing the partial pressure of oxygen during annealing of the semiconductor devices which results in a reduction of uncontrolled doping from the gate electrodes of the semiconductor devices to the channel regions of the semiconductor devices.

Figure 1:
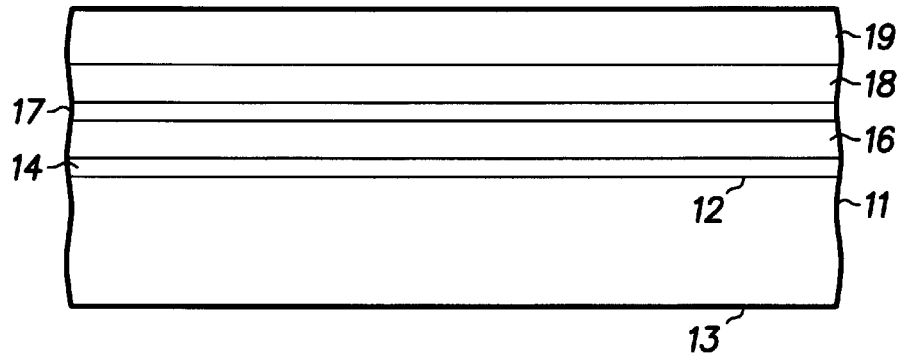
FIG. 1 is a cross-sectional view of a portion of a semiconductor device during processing in accordance with the present invention.

FIG. 1 is a cross-sectional view of a portion of a Metal Oxide Semiconductor (MOS) device 10 during processing in accordance with the present invention. What is shown in FIG. 1 is a semiconductor substrate 11 of P conductivity type having a top surface 12 and a bottom surface 13.

A layer 14 of dielectric material such as, for example, oxide, is formed on top surface 12. A suitable technique for forming oxide layer 14 is thermal oxidation. Preferably, oxide layer 14 has a thickness ranging from approximately 100 angstroms to approximately 1,000 angstroms.

A layer 16 or polysilicon is formed on oxide layer 14 using, for example, chemical vapor deposition. Polysilicon layer 16 is doped with a dopant or impurity material of P conductivity type such as, for example, boron. By way of example, the boron concentration is $10^{20}$ atoms per cubic centimeter (atoms/cm$^3$). Suitable techniques for doping polysilicon layer 16 include implantation, diffusion, in situ doping, or the like. A suitable thickness range for polysilicon layer 16 is from approximately 2,500 angstroms to approximately 5,000 angstroms. A typical thickness for polysilicon layer 16 is approximately 4,000 angstroms.

A layer 17 of dielectric material is formed on polysilicon layer 16. For example, layer 17 is a layer of oxide formed by the decomposition of tetraethyl orthosilicate (TEOS). Oxide layers formed by the decomposition of tetraethyl orthosilicate are commonly referred to as TEOS layers. By way of example, oxide layer 17 has a thickness ranging from approximately 50 angstroms to approximately 400 angstroms and a nominal thickness of approximately 150 angstroms.

A layer 18 of silicon nitride is formed on oxide layer 17 using, for example, a Low Pressure Chemical Vapor Deposition (LPCVD) technique. A suitable range of thicknesses for silicon nitride layer 18 is between approximately 150 angstroms and approximately 350 angstroms, and a nominal thickness for silicon nitride layer 18 is approximately 250 angstroms.

A layer 19 of phosphorus doped oxide is formed on silicon nitride layer 18. A suitable range of thicknesses for phosphorus doped oxide layer 19 is between approximately 3,000 angstroms and approximately 5,000 angstroms, and a nominal thickness for phosphorus doped oxide layer 19 is approximately 4,000 angstroms. It should be understood that the thickness of layers 16, 17, 18, and 19 are not limitations of the present invention.

Figure 2:
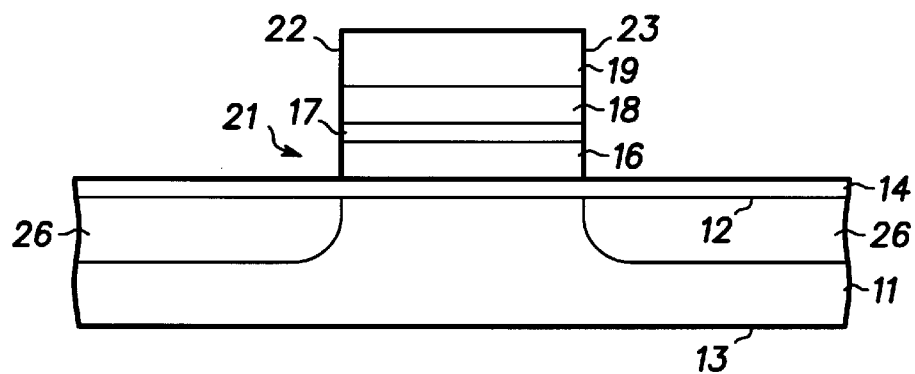
FIG. 2 is a cross-sectional view of the semiconductor device of FIG. 1 at a later stage of processing.

Now referring to FIG. 2, a gate structure 21 is formed from portions of layers 14 and 16. Gate structure 21 may be formed, for example, by coating phosphorus doped oxide layer 19 with a layer of photoresist (not shown), exposing the portions of phosphorus doped oxide layer 19 to be removed (using, for example, photolithographic techniques), and anisotropically etching the exposed portions of phosphorus doped oxide layer 19. In addition, the portions of nitride layer 18, oxide layer 17, and polysilicon layer 16 below the exposed portions of phosphorus doped oxide layer 19 are also etched, thereby exposing portions of oxide layer 14 and forming sidewalls 22 and 23.

A doped region 26 is formed by doping a portion of substrate 11 with an impurity material of N conductivity type such as, for example, phosphorus. More particularly, the phosphorus is implanted into a portion of substrate 11 to form doped region 26. Doped region 26 is laterally aligned to sidewalls 22 and 23. By way of example, a suitable set of implant parameters includes implanting the N type impurity material at a dose ranging from approximately $7.1 \times 10^{13}$ atoms/cm$^3$ to approximately $7.9 \times 10^{13}$ atoms/cm$^3$ at an implant energy ranging from approximately 105 keV to approximately 135 keV.

Device 10 is annealed in an ambient containing oxygen, wherein a partial pressure of the oxygen is greater than 11.85 Torr. To optimize for decreasing threshold voltage variation between semiconductor devices, the partial pressure of the oxygen is preferably greater than approximately 36 Torr. Preferably, this annealing process is performed at a temperature of approximately 1080° C. and oxygen is provided to the ambient during the annealing process. The thickness of oxide layer 14 may vary as a result of annealing device 10 in an ambient containing oxygen. In order to achieve a desired or target thickness for oxide layer 14, the oxygen provided to the ambient can be turned off before the annealing process is complete. For example, if the annealing process for device 10 takes 1 hour and the partial pressure of the oxygen is approximately 36 Torr, then the oxygen provided to the ambient is turned off after 18 minutes to achieve a target thickness of approximately 230 angstroms for oxide layer 14.

Figure 3:
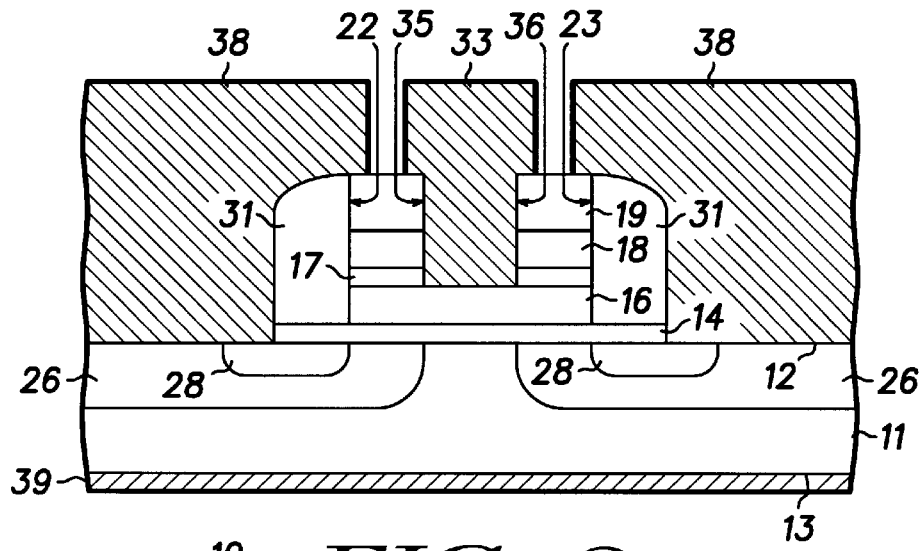
FIG. 3 is a cross-section view of the semiconductor device of FIG. 2 at an even later stage of processing.

Now referring to FIG. 3, after device 10 is annealed, doped region 26 extends underneath gate structure 21. A doped region 28 is formed by doping a portion of doped region 26 with an impurity material of P conductivity type such as, for example, boron. More particularly, the boron is implanted into a portion of doped region 26 to form doped region 28. Doped region 28 is laterally aligned to sidewalls 22 and 23. By way of example, a suitable set of implant parameters includes implanting the P type impurity material at a dose ranging from approximately $0.95 \times 10^{15}$ atoms/cm$^3$ to approximately $1.05 \times 10^{15}$ atoms/cm$^3$ at an implant energy ranging from approximately 80 keV to approximately 100 keV.

Still referring to FIG. 3, sidewall spacer 31 is formed along sidewalls 22 and 23. Techniques for forming sidewall spacer 31 are well known to those skilled in the art. For example, an oxide sidewall spacer can be formed by depositing an oxide layer on gate structure 21 and on oxide layer 14. The oxide layer is anisotropically etched, removing the portion of the oxide layer over gate structure 21 and a portion of the oxide layer that is on layer 14 and leaving the portion of the oxide layer along sidewalls 22 and 23, i.e., leaving sidewall spacer 31.

A gate electrode 33 is formed in contact with polysilicon layer 16. By way of example, gate electrode 33 is formed by etching an opening (not shown) in layers 17, 18, and 19, where the opening has sidewalls 35 and 36. A conductive material is disposed in the opening and along sidewalls 35 and 36 to form gate electrode 33. A source electrode 38 is formed in contact with doped regions 26 and 28. More particularly, source electrode 38 is formed by disposing a conductive material on top surface 12, along spacer 31, and spaced apart from gate electrode 33. A drain electrode 39 is formed in contact with bottom surface 13. More particularly, drain electrode 39 is formed by disposing a conductive material on bottom surface 13. Suitable conductive materials for gate electrode 33, source electrode 38, and drain electrode 39 include copper, aluminum, copper alloys, aluminum alloys, or the like. Device 10 is annealed in an ambient containing nitrogen. This annealing step is performed at a temperature of approximately 900° C.

It should be noted that electrodes are also referred to as electrical contacts. Further, drain electrode 39 is referred to as a bottom-side contact. Although device is described as having a bottom-side contact for drain electrode 39, this is not a limitation of the present invention, device 10 may have a top-side contact for drain electrode 39.

Figure 4:
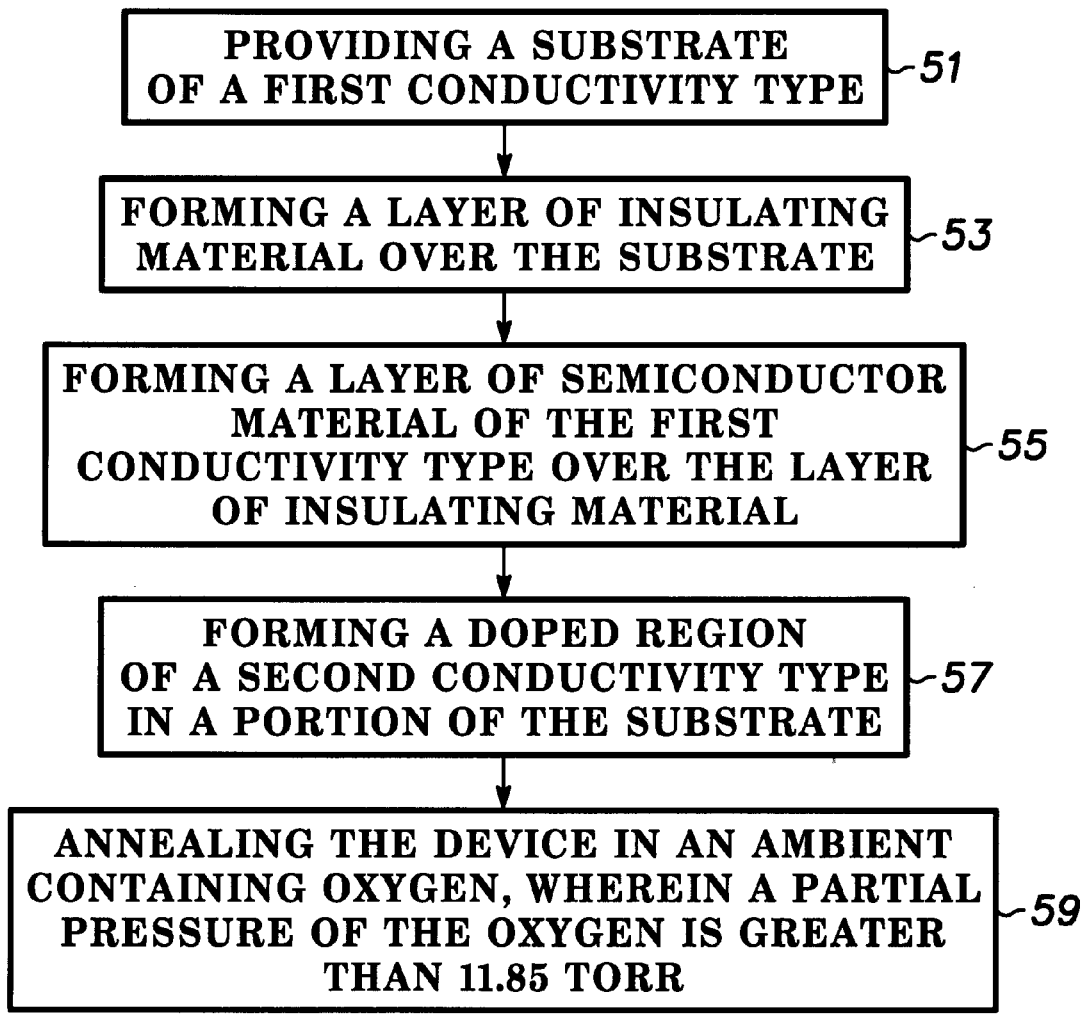
FIG. 4 is a flow diagram of a method for manufacturing a semiconductor device in accordance with the present invention.

FIG. 4 is a flow diagram 50 of a method for manufacturing a semiconductor device in accordance with the present invention. A beginning step 51 in designing a semiconductor device such as, for example, MOS device 10 (FIG. 3) is providing a semiconductor substrate of a first conductivity type, i.e., substrate 11 of P conductivity type.

In step 53, a layer of insulating material is formed over the top surface of the, substrate. Step 53 is preferably followed by a step 55 and includes forming a layer of semiconductor material of the first conductivity type over the first layer of insulating material. In accordance with the present example, oxide layer 14 is formed on top surface 12 of substrate 11 and polysilicon layer 16 is formed on oxide layer 14.

In step 57, a doped region of a second conductivity type is formed in a portion of the semiconductor substrate. In the present example, doped region 26 of N conductivity type is formed in a portion of substrate 11. Step 57 is preferably followed by step 59 and includes annealing MOS device 10 in an ambient containing oxygen, wherein a partial pressure of the oxygen is greater than 11.85 Torr.

Although the steps of method 50 are described using MOS device 10 as an example, this is not a limitation of the present invention. For example, the steps of method 50 can be applied to bipolar devices and integrated circuits.

By now it should be appreciated that a method for manufacturing a semiconductor device has been provided. A benefit of the present invention is that it provides a method for manufacturing semiconductor devices that decreases the variation of threshold voltages between these devices. Further, the method is compatible with standard semiconductor processing techniques.

We claim:

1. A method for manufacturing a semiconductor device, comprising the steps of:

providing a semiconductor substrate of a first conductivity type and having first and second major surfaces;

forming a first layer of insulating material over the first major surface;

forming a layer of semiconductor material over the first layer of insulating material, the layer of semiconductor material of the first conductivity type;

forming a first doped region in a portion of the semiconductor substrate, the first doped region of a second conductivity type; and annealing the semiconductor substrate in an ambient containing oxygen, wherein a partial pressure of the oxygen is greater than 11.85 Torr.

2. The method of claim 1, wherein the first layer of insulating material is oxide.

3. The method of claim 1, wherein the step of forming a first doped region includes using one of implantation or diffusion to form the first doped region.

4. The method of claim 1, further including a step of forming a second doped region in the semiconductor substrate, the second doped region of the first conductivity type.

5. The method of claim 1, further including the steps of:

forming a first electrical contact to the first doped region; and forming a second electrical contact to the layer of semiconductor material.

6. The method of claim 5, further including the step of forming a third electrical contact to the second major surface.

7. The method of claim 1, wherein the step of annealing the semiconductor substrate in an ambient containing oxygen further includes turning off the oxygen that is provided to the ambient before the annealing step is completed.

8. The method of claim 1, further including the step of forming a second layer of insulating material over the layer of semiconductor material.

9. The method of claim 1, wherein the step of annealing the semiconductor substrate in an ambient containing oxygen includes annealing the semiconductor substrate in an ambient containing oxygen having a partial pressure of approximately 36 Torr.

10. The method of claim 1, wherein the first conductivity type is P conductivity type and the second conductivity type is N conductivity type.

11. The method of claim 1, further including the step of annealing the semiconductor substrate in an ambient containing nitrogen.

12. The method of claim 1, wherein the step of annealing the semiconductor substrate includes annealing the semiconductor substrate for a period of time in accordance with a thickness of the first layer of insulating material.

13. A method for manufacturing a semiconductor device, comprising the steps of:

providing a semiconductor substrate having a top surface, a bottom surface, and a gate structure formed on the top surface, wherein the gate structure has first and second sidewalls;

forming a doped region in the semiconductor substrate, the doped region aligned to at least the first sidewall; and annealing the semiconductor substrate in an ambient containing oxygen, wherein a partial pressure of the oxygen is greater than 11.85 Torr.

14. The method of claim 13, wherein the step of providing the semiconductor substrate includes providing a gate structure comprising a gate dielectric material disposed on the semiconductor substrate and an electrically conductive material disposed on the gate dielectric material.

15. The method of claim 13, further including the steps of:

forming a first contact to the doped region;

forming a second contact to the gate structure; and forming a bottom-side contact to the bottom surface of the semiconductor substrate.

16. The method of claim 13, wherein the step of annealing the semiconductor substrate in an ambient containing oxygen further includes turning off the oxygen that is provided to the ambient before the annealing step is completed.

17. A method for manufacturing an insulated gate field effect transistor, comprising the steps of:

providing a semiconductor substrate of a first conductivity type and having first and second major surfaces;

forming a gate structure on the first major surface, the gate structure having first and second sidewalls;

forming a first doped region of a second conductivity type in the semiconductor substrate, the first doped region aligned to the first and second sidewalls;

annealing the semiconductor substrate in an ambient containing oxygen, wherein a partial pressure of the oxygen is greater than 11.85 Torr; and forming a gate contact to the gate structure, a source contact to the first doped region, and a drain contact to the second major surface.

18. The method of claim 17, further including the step of forming a second doped region of the first conductivity type in the first doped region.

19. The method of claim 17, wherein the step of annealing includes annealing the semiconductor substrate in an ambient containing oxygen, wherein the oxygen has a partial pressure of 36 Torr.

20. The method of claim 17, wherein the step of forming the drain contact includes forming at least one layer of metal on the second major surface.

* * * * *